United States Patent

Harnden, Jr.

[15] 3,670,639

[45] June 20, 1972

[54] FLEXIBLE ELECTRONIC INTEGRATED CIRCUIT CAMERA CONTROL ASSEMBLY

[72] Inventor: John D. Harnden, Jr., Schenectady, N.Y.

[73] Assignee: General Electric Company

[22] Filed: Dec. 16, 1968

[21] Appl. No.: 791,846

[52] U.S. Cl. ..............................95/11 L, 240/1.3, 317/101 F
[51] Int. Cl. ..............................G03b 15/03
[58] Field of Search ..............................95/11, 11.5, 10; 317/101 CC, 317/101 F, 101 B, 101 CP; 240/1.3; 174/DIG. 3

[56] References Cited

UNITED STATES PATENTS

| | | | |
|---|---|---|---|
| 3,430,545 | 3/1969 | Wick | 240/1.3 |
| 3,518,487 | 6/1970 | Tanaka et al. | 240/1.3 X |
| 3,390,308 | 6/1968 | Marley | 174/DIG. 3 |
| 3,440,027 | 4/1969 | Hugle | 174/DIG. 3 |
| 3,484,654 | 12/1969 | Honeiser | 317/101 F |
| 3,499,220 | 3/1970 | Hintz et al. | 317/101 F |
| 3,535,530 | 10/1970 | Cooper et al. | 95/10 C X |
| 2,969,517 | 1/1961 | Gluck | 317/101 CC X |
| 3,039,177 | 6/1962 | Burdett | 317/101 B X |
| 3,065,383 | 11/1962 | Guillemot | 317/101 B |
| 3,085,486 | 4/1963 | Bushman et al. | 95/10 C X |
| 3,353,069 | 11/1967 | Slavin | 317/101 |
| 3,357,328 | 12/1967 | Kinder et al. | 95/11 |
| 3,374,537 | 3/1968 | Doelp, Jr. | 317/101 CP X |
| 3,417,294 | 12/1968 | Steidlitz | 317/101 CP |
| 3,480,836 | 11/1969 | Aronstein | 317/101 CP X |
| 3,500,737 | 3/1970 | Mayr et al. | 95/10 X |

*Primary Examiner*—Samuel S. Matthews
*Assistant Examiner*—Robert P. Greiner
*Attorney*—Joseph B. Forman, Norman C. Fulmer, Henry P. Truesdell, Frank R. Neuhauser and Oscar B. Waddell

[57] ABSTRACT

An electronic integrated circuit assembly intended for the control of automatic cameras comprises a flexible, electrically insulating, supporting member having a plurality of electronic control sub-circuits formed thereon including both active semiconductor devices and passive circuit components and the electrically conductive paths interconnecting the active semiconductor devices and passive circuit components in electrical circuit relationships for performing a desired sub-circuit control function, and further including the conductive paths required to energize the sub-circuits and supply the outputs thereof to others of the sub-circuits and to the respective sub-systems being controlled. The assembly is entirely flexible and capable of being intertwined and disposed in otherwise unuseable, irregular spaces in the interior of a housing whereby the overall size of the housing can be minimized. The particular assembly disclosed is intended for use with an automatic camera for electronically, selectively flashing the respective bulbs of a multiple array of photoflash bulbs and/or automatically timing and variably controlling the exposure period of the camera in response to lighting conditions of a subject being photographed to thereby obtain optimum exposure of a film frame. The active semiconductor device employed in the circuits may be fabricated in monolithic integrated circuit form, and the assembly is provided with an overlying protective electrical insulating layer that conforms substantially to the silhouette of the assembly and which extends over substantially the entire surface of the assembly on the side opposite the flexible insulating member excluding any contact areas for external connections. The assembly may comprise a hybrid, integrated circuit with the conductive paths being formed by laminated conductive runs of an electrically conductive material such as copper formed on the insulating supporting member by known printed conductor techniques with the passive circuit element including at least one capacitor of the pumpkin seed variety. Alternatively, the assembly may be fabricated using thin film circuit techniques.

13 Claims, 7 Drawing Figures

Inventor
John D. Harnden, Jr.,
by Donald R. Campbell
His Attorney

INVENTOR:

JOHN D. HARNDEN, JR.

by Donald R. Campbell

HIS ATTORNEY

INVENTOR:

JOHN D. HARNDEN, JR.

by Donald L. Campbell

HIS ATTORNEY

FLEXIBLE ELECTRONIC INTEGRATED CIRCUIT CAMERA CONTROL ASSEMBLY

This invention relates to a new and improved, flexible, electronic, integrated circuit, control assembly, and in particular to a camera control assembly of the type which may be disposed in the interior of a housing (such as a camera housing) for electronically controlling at least one of the cameras sub-systems, and which does not require any substantial increase in the overall size of the housing.

More specifically, the invention relates to a flexible, integrated circuit, electronic control for a camera and which includes active semiconductor devices, passive components, and required conductor runs interconnecting the various parts of the control in circuit relationship. Because of its flexible nature, the camera control assembly may be intertwined and physically positioned in otherwise unuseable, irregular spaces in the interior of a camera housing without requiring any specially allocated, substantial space allotment within the housing whereby the overall size of the camera housing can be minimized.

In a recent development, static, electronic, integrated circuit sub-assemblies have been made available to the photographic art for use in electronically, selectively flashing the respective bulbs of a multiple array of photoflash bulbs. The present invention allows the flash sequence control sub-circuit for such sub-assemblies to be fabricated on a flexible, insulating, backing member whereby such sub-circuits embody the characteristics noted above. In addition, there are known electronic, integrated circuit, control assemblies for electronically, automatically timing and variably controlling the exposure period of a camera in response to lighting conditions of a subject being photographed to thereby obtain optimum exposure of a film frame. Such electronic, integrated circuit, automatic exposure control sub-assemblies also can be fabricated on a flexible insulating supporting member in accordance with the invention to achieve the desirable characteristics noted above. However, one of the most desirable advantages of the present invention lies in the fact that because of the nature of the flexible, insulating, supporting member, it now becomes possible to combine the integrated circuit control function, the internal sub-circuit interconnection function, the external interconnection between the various sub-circuits function, and the connections to outside power sources and to the sub-assemblies being controlled function, into one truly, single, electronic, integrated circuit, camera control assembly which is capable of controlling not only flash sequence but exposure control as well, in addition to any other sub-assembly control functions that may be desired.

While the specific application of the invention herein described is in connection with the fabrication of a control for a plurality of automatic camera sub-circuits comprising an overall, automatic camera control system that provides optimum exposure conditions for an exposed film frame, it is to be expressly understood that the invention is in no way limited to application with cameras alone. If desired, the invention may be used in conjunction with any electronic control system comprised of a plurality of electronic sub-system control circuits, each subject to microminiturization, for fabricating such plurality of electronic sub-system control circuits together in a truly, single, electronic, integrated circuit, control assembly. Thus, it will be appreciated that the invention provides an entire new dimension (technique) to the art of packaging of multiple, microminiturized electronic sub-systems into a single or unitary structure and which are intended to operate either independently or interdependently in the control of an overall system. Such packaging is particularly advantageous in the construction of electronically controlled equipments having space requirement limitations. Another important advantage of the invention is that it makes possible the elimination of extraneous conductor runs, jumper connectors, and the like, and is particularly advantageous in that it can provide required, interconnecting conductor runs between interdependent, sub-circuits of an overall system on the same flexible, insulating, supporting member used for the plurality of control sub-circuits.

It is therefore a primary object of the present invention to provide a new and improved, flexible, electronic, integrated circuit, control assembly for use in controlling at least one sub-system of an overall, electronically controlled equipment, and which may be disposed in the interior of the housing for such equipment without requiring any substantial increase in the overall size of the equipment housing.

A particular object of the invention is to provide a flexible, integrated circuit, electronic control for a camera which control includes active semiconductor devices, passive components and conductive runs interconnecting the control in circuit relationship. Because of its flexible nature, the assembly may be intertwined around parts and physically positioned in otherwise unuseable, irregular spaces in the interior of the camera housing whereby the overall size of the housing can be minimized. In this manner the sub-circuits for the exposure control as well as flash sequence of an automatic, electronically operated camera, together with required interconnecting conductor runs, all can be fabricated in a single, flexible assembly.

In practicing the invention, an electronic integrated circuit control assembly is provided for electronically controlling the operation of a plurality of electronically controlled subsystems. The electronic, integrated circuit, control assembly comprises a flexible, electrically insulating, supporting member having an electronic camera control circuit formed thereon comprising both active semiconductor devices and passive, electronic circuit components and further including conductive paths interconnecting the active semiconductor devices and passive components in electrical circuit relationship for performing a desired camera control function. The flexible, insulating, assembly is entirely flexible and capable of being intertwined around and disposed in otherwise unuseable, irregular spaces in the interior of a camera housing without requiring any specially allocated substantial space allotment within the housing thereby allowing the overall size of the camera housing to be minimized. In one form of the invention, the flexible control assembly controls the operation of only a single camera sub-assembly; however, it is entirely feasible for the flexible, control assembly to control the operation of a plurality of automatic camera sub-assemblies. While a control for an automatic camera is disclosed and described in detail, the assembly also can be employed in the fabrication of other electronic equipments comprised by a plurality of microminiaturized, control sub-circuits for interconnecting such control sub-circuits into an overall system.

The flexible, insulating supporting member is preferably comprised by a solid, organic resin such as MYLAR or a polyimide such as KAPTON. The active semiconductor devices used in the assembly are fabricated in monolithic integrated circuit form and have contact areas that are electrically interconnected to matching contact areas formed on the conductive paths by firmly bonding the respective sets of matched contact areas together. Preferably, the assembly is provided with an overlying, protective, electrical insulating layer that conforms substantially to the silhouette of the assembly, and which extends over substantially the entire surface area of the assembly on the side opposite the flexible insulating supporting member excluding any contact areas for external connection.

In one form of the invention, the flexible, control assembly comprises a hybrid integrated circuit and the conductive paths are formed by laminated conductive runs of an electrically conductive material such as copper formed on the insulating supporting member by known printed conductor techniques. In this structure, the passive circuit elements may include at least one capacitor component of the pumpkin seed capacitor type having one electrode secured to a conductive pad comprising a part of the conductive runs of the circuit and with a remaining electrode fly-leaded to an appropriate conductive run with the resistor component comprising appropriately dimensioned portions of conductive runs. In another form of the flexible, control assembly, the assembly comprises a thin film integrated circuit wherein at least the conductive paths and the passive circuit elements are formed by thin film circuit techniques.

Other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein.

Figure 2:
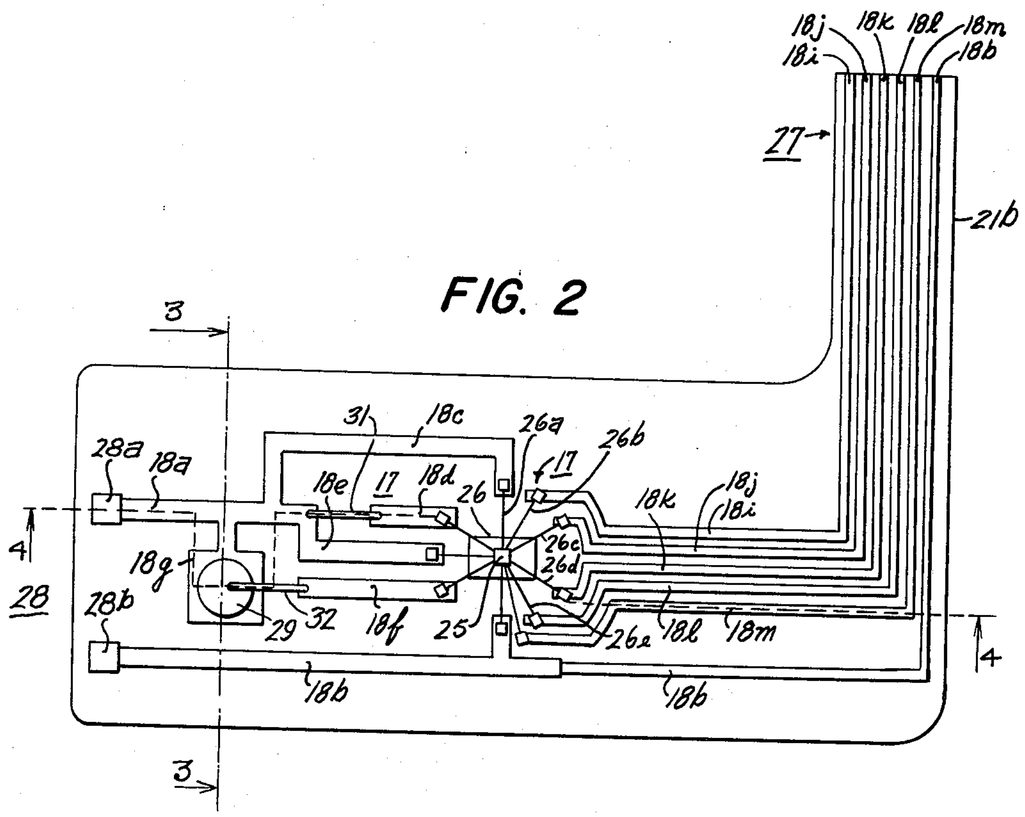
FIG. 2 is a plan view of one form of a flexible, electronic, integrated circuit control assembly constructed in accordance with the invention, and suitable for use with the camera control of the camera shown in FIG. 1.
Figures 5, 5A, 5B:
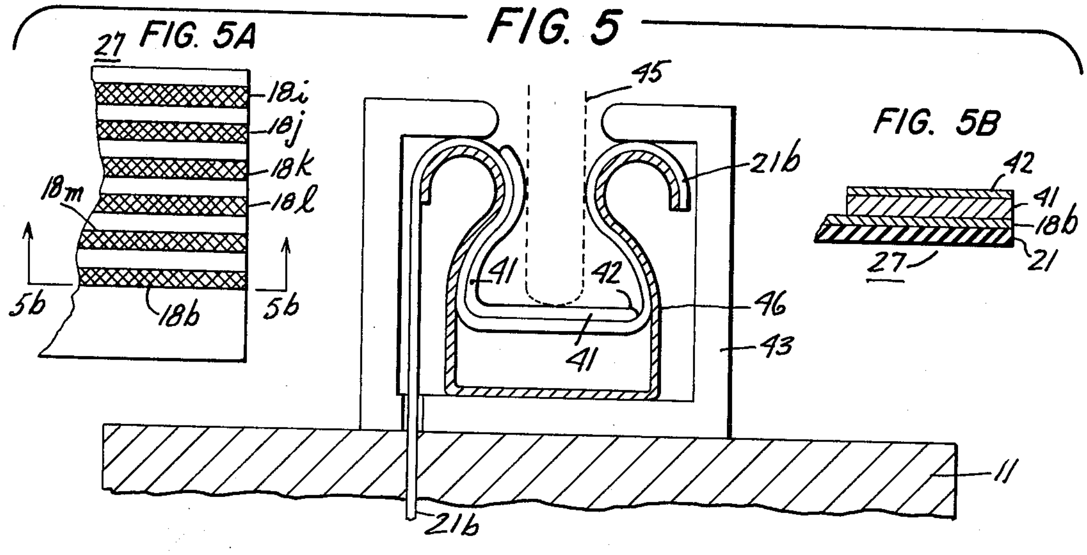
Figure 6:
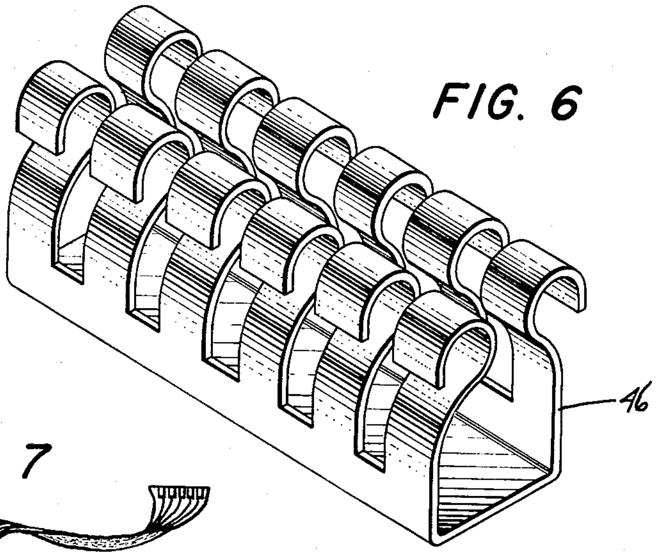
Figure 7:
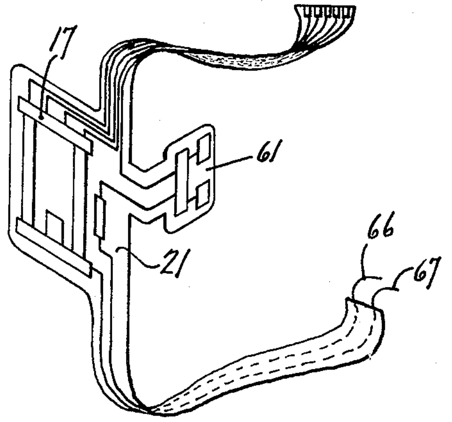

FIGS. 5, 5*a* and 5*b* show the details of construction of a common contact area formed by the ends or terminals of the conductive runs of the assembly shown in FIG. 2;

FIG. 6 is a prespective view of a preferred form of a spring clip utilized in the flash attachment receptacle shown in cross section in FIG. 5; and FIG. 7 is a perspective view of an alternative form of flexible, camera control assembly constructed in accordance with the invention wherein the flexible control assembly is capable of controlling at least two different sub-systems of an automatic, electronically controlled camera.

Figure 1:
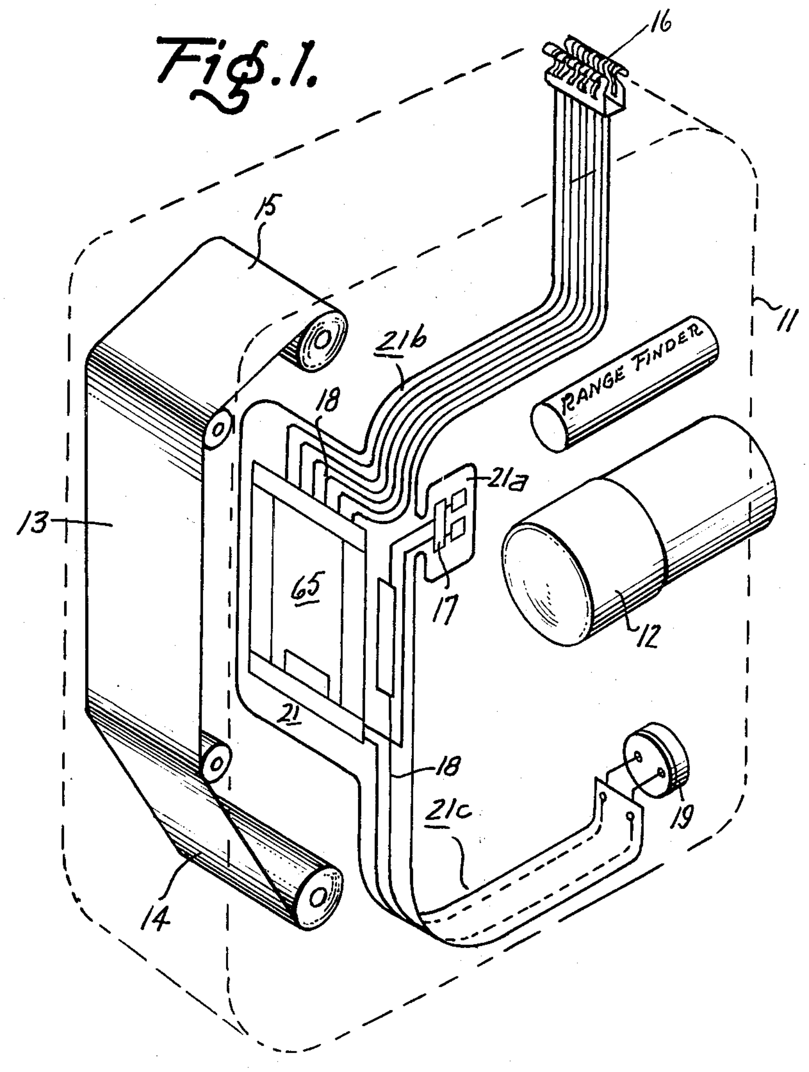
FIG. 1 is a partially broken-away perspective view of an automatic, electronically controlled camera utilizing the new and improved, flexible, electronic, integrated circuit, camera control assembly constructed in accordance with the invention, and illustrates the manner of use of the particular embodiment of the invention described.

FIG. 1 of the drawings is a partially broken-away, perspective view of a automatically operating, electronically controlled camera having a housing 11 in which an optical system comprised by a lens assembly 12 focuses a subject to be photographed onto a frame of a photosensitive film shown at 13 which is transported between a supply roll 14 and a take-up roll 15. The camera 11 is of the type which utilizes an electronically controlled flash attachment, that may be clipped into a flash attachment receptacle shown generally at 16 on the top of the camera housing. The particular flashbulb attachment that is clipped into the sliding contact fingers shown generally at 16 is described more fully in U.S. Pat. No. 3,598,985, issued Aug. 10, 1971 — J.D. Harden, Jr. and W.P. Kornrumpf, inventors — entitled "Construction of Disposable Photoflash Lamp Array," and assigned to the General Electric Company; and in U.S. Pat. No. 3,598,984, issued Aug. 10, 1971, S.L. Slomski entitled "Photoflash Lamp Array," and assigned to the General Electric Company.

The array of photoflash lamps that can be detachably clipped into the contact fingers 16 are selectively flashed by a static, electronic control circuit shown generally at 17. As will be described more fully hereinafter, the static, electronic control circuit 17 is fabricated in accordance with integrated circuit techniques, and is electrically connected through suitable conductive paths or runs 18 to the several contact fingers shown generally at 16. In addition, the control circuit 17 is supplied through conductive paths or runs 18 to the terminals of a battery shown at 19 for supplying energizing current through the control circuit 17 to the respective contact fingers 16 for selectively flashing the detachable flashbulbs secured in the contact fingers 16. For a more detailed description of the construction and operation of the control circuit 17, reference is made to United States patent application Ser. No. 784,093 - J.D. Harnden, Jr. and W.P. Kornrumpf, inventors entitled "-Static Electronic Photoflash Assembly and Method of Photoflash Lighting," and to United States patent application Ser. No. 784,067, now abandoned, John D. Harnden, Jr., William P. Kornrumpf and Robert Marquardt, inventors entitled "Sequential Flashing of Multiple Flashlamps by Low Cost Static Control Circuit of Integrated Design" both filed Dec. 16, 1968 and assigned to the General Electric Company. Briefly, however, it can be stated that the electronic control circuit 17 is comprised of both active semiconductor devices and passive electronic circuit components and includes conductive paths or runs interconnecting the active semiconductor devices and passive components in electrical circuit relationship for performing a desired camera control function such as selective flashing of respective ones of the array of flash bulbs detachably clipped into the flashbulb attachment contact fingers 16. Electric current for energizing the control circuit 17 and selectively flashing the respective flashbulbs clipped into the contact fingers 16 is supplied from the battery 19 over the conductive runs 18, through the control circuit 17 and thence to the flashbulbs via the contact fingers 16.

From a consideration of FIG. 1, it will be seen that the control circuit 17 is formed on a portion 21*a* of a backing, flexible, electrically insulating supporting member 21 having an arm portion 21*b* extending up to the contact fingers 16 on which conductive paths or runs are formed, and having an arm portion 21*c* extending down to the battery 19 on which the conductive runs 18 are formed. It will also be seen that the flexible, electrically insulating supporting member 21 and the various arm portions 21*a*–21*c* thereof are entirely flexible and capable of being intertwined around the various parts of the camera and disposed in otherwise unuseable irregular spaces in the interior of the camera housing. Thus, it can be appreciated that the insulating backing member 21 together with its conductive runs and attached control circuit 17, may be disposed within the camera housing without requiring any specially allocated substantial space allotment within the housing whereby the overall size of the camera housing can be minimized. While camera manufacturers have used flexible printed conductor runs formed on flexible, electrically insulating backing members such as MYLAR in the past due to the advantages of compactness, conformity, flexibility, reliability and relatively low cost, such structures heretofore have not also embodied as an integral part thereof the necessary active semiconductor devices and passive circuit components all interconnected in circuit relationship through suitable conductive runs to form the complete control. Thus, it will be seen that the present invention provides a truly unitary, integrated circuit approach to the fabrication of suitable controls for electronically controlled cameras and other similar equipments. This is particularly advantageous where there is an overall system requiring a plurality (two or more) sub circuits controlling corresponding sub-assemblies of the overall system whereby all of the sub-circuits together with the required interconnecting conductive runs may be fabricated on a single, electrically insulating, flexible backing member thereby making it possible to package the overall control system in a truly integrated circuit fashion.

FIG. 2 is a plan view of an electronic, integrated circuit camera control assembly constructed in accordance with the invention. In FIG. 2, the flexible assembly is illustrated as being formed on a flexible electrical insulating supporting member 21 which is comprised of a solid organic resin such as the polyester known as MYLAR manufactured by the DuPont Chemical Company. Because of its somewhat lower cost, the flexible insulating backing member 21 preferably would be comprised by MYLAR provided that the overall control assembly is to be used in an environment which does not have a temperature range extending above 175° C. In the event that the circuit is to be employed in higher ambient temperature conditions, then a material such as KAPTON would be employed which is capable of maintaining its characteristics up to a temperature range of 250° to 350° C. Other satisfactory flexible electrical insulating materials also might suitably be employed as the supporting member 21.

The control sub-circuit 17 formed on the MYLAR backing member 21 is shown as being comprised of a plurality of conductive runs 18*a*, 18*b*, etc., interconnecting the active semiconductor devices and passive circuit components that comprise the sub-circuit. The details of construction and operation of the sub-circuit are described in a co-pending United States patent application Ser. No. 784,067, how abandoned John D. Harnden, Jr., W.P. Kornrumpf, and R.A. Marquardt, inventors, entitled "Sequential Flashing of Multiple Flashlamps by Low Cost Static Control Circuit of Integrated Design," filed concurrently herewith, and in particular in FIG. 3 of that co-pending application. The sub-circuit preferably is fabricated in monolithic, integrated circuit form and comprises a single, monolithic, integrated circuit chip shown at 25 fabricated in accordance with conventional monolithic integrated circuit fabrication techniques. The monolithic chip 25 may be mounted on a second suitable insulating carrier 26 having a plurality of conductive runs shown at 26*a*, 26*b*, etc. for fanning out from the contact areas of the monolithic integrated circuit chip 25. The manner in which the monolithic integrated circuit chip 25 is secured to the second insulating supporting member or carrier 26 to achieve the fanning out connection to the fanning out conductive paths 26*a*, 26*b*, etc. is described more fully in a co-pending United States patent application Ser. No. 709,561 filed Mar. 1, 1968, entitled "Semiconductor Devices and Manufacture Thereof" — Alanson D. Aird inventor, assigned to the General Electric Company.

With a construction using the fanning out carrier 26, the manner in which the fanning out conductive paths formed on the second insulating carrier 26 are bonded to the matching contact areas of the conductive runs 18*c*–18*f* and 18*i*–18*m* and 18*b*, is described more fully in co-pending United States patent application Ser. No. 784,141, now abandoned, by C.J. Waters entitled "Thin Film Circuits on Flexible Dielectric Substrates" — filed concurrently with this application and assigned to the General Electric Company, and in the above referenced United States patent application Ser. No. 709,561. As an alternative to firmly bonding together the respective matched sets of contact areas, it is also possible to use cat-whisker type, fly-lead conductors interconnecting the respective matched sets of contact areas in a well known manner. However, the fly-lead type of connector is not preferred since it does not lend itself to continuous, in-process manufacturing techniques as readily as does the bonding together of the respective matched sets of contact areas. Additional techniques for bonding together the matched sets of contact areas on the monolithic active semiconductor device chip 25 with the fanning out conductors, and the bonding together of any intermediate fanning out conductors with the conductive runs 18*b*– 18*m*, are described in an article appearing – Electronics Magazine — Nov. 25, 1968 issue, pages 72–80.

In place of forming the active semiconductor devices on the flexible MYLAR or KAPTON backing member by separately fabricating such devices in monolithic integrated circuit chips either as individual devices or as sub-circuit stages as shown in FIG. 2 and described above, it is also possible to fabricate the active semiconductor devices directly on the flexible, insulating back member. For example, in Electronics Magazine, Aug. 19, 1968 issue, pages 100 –103, an article entitled "Flexible Thin Film Transistors Stretch Performance, Shrink Cost" by Peter Brody and Derrick Page, a continuous batch process for fabricating thin film transistors directly onto a flexible, insulating, supporting member of MYLAR, of other similar material, is described. If desired, the active semiconductor devices formed on the flexible insulating supporting member 21 may be fabricated directly on this member in a manner similar to that taught by the above-referenced Brody and Page article in Electronics Magazine. Thus, in forming the active semiconductor devices on the flexible MYLAR supporting member, these devices may be attached to conductive runs on the MYLAR supporting member as taught in application Ser. No. 709,561 — Aird, or they may be fabricated directly onto the flexible MYLAR supporting member as taught in the Brody and Page Electronics article.

As will be described more fully hereinafter, one form of the invention utilizes hybrid integrated circuit techniques in the fabrication of the assembly, and in this form of the invention, the conductive paths or conductor runs 18*a*–18*m* are fabricated of an electrically conductive material such as copper formed on the insulating supporting MYLAR member 21 in accordance with well known printed conductor techniques such as electro-deposition and subsequent etching, or by etched foil techniques such as are described in U.S. Pat. No. 2,911,605, or other similar techniques. In fabricating the conductive runs 18*a*–18*m*, certain of the conductive runs such as 18*i*–18*m* and 18*b* are caused to extend substantially in a parallel or converging pattern to a common contact area such as shown at 27 or 28. The contact area 27 is formed on an elongated tape-like extension 21*b* of the flexible insulating supporting MYLAR member 21 whereby electrical connections to and from the control circuit can be effected readily. The contact area 28 provides two contact pads 28*a* and 28 *b* for connection to a low energy source of electric potential such as the battery 19 shown in FIG. 1.

In the hybrid integrated circuit form of the assembly shown in FIG. 2, the passive circuit elements are comprised by a capacitor component 29 and a resistor component 31 in addition to the various passive circuit components built into the monolithic integrated circuit chip indicated generally at 25 in accordance with well known monolithic integrated circuit techniques. The capacitor component 29 may comprise a small, discrete capacitor of the "pumpkin seed" type having one of its electrodes firmly bonded to a conductive pad 18*g* comprising a part of the conductive runs 18 formed on the flexible, insulating supporting member 21. The remaining electrode 33 of the "pumpkin seed" capacitor 29 may be connected through a suitable cat-whisker type of fly-lead connection 32 to a conductive run 18*f* for connection into circuit relationship with the active semiconductor devices and other passive circuit components comprising a part of the monolithic integrated circuit chip 25. The resistor component 31 may comprise an appropriately dimensioned portion of a conductive run such as 18d which has been partially etched away or otherwise removed to provide a precise and desired amount of electrical resistance in the path provided by this conductive run.

Figure 3:
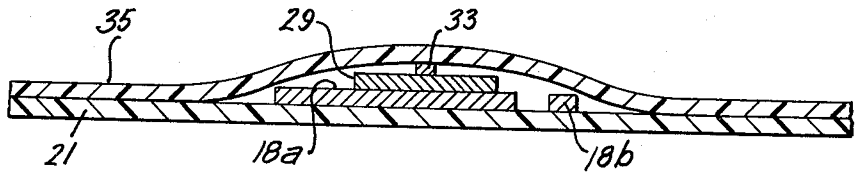
FIG. 3 is a partial cross sectional view of the assembly shown in FIG. 2 taken through plane 3—3 considering that the assembly of FIG. 2 was fabricated using hybrid integrated circuit techniques.

FIG. 3 is a cross sectional view of a hybrid integrated circuit form of the invention taken through plane 3—3 of FIG. 2. In FIG. 3, the MYLAR, flexible, electrically insulating supporting member 21 is illustrated as having a thickness of about 0.001 to 0.005 inches. This thickness may vary above or below the values cited, however these are believed to be exemplary values and may differ somewhat for a different flexible insulating material such as KAPTON. The conductor runs 18*a*, 18*b* and the conductive pad 18g are illustrated as having a thickness of about 0.001 inches and may comprise etched copper foil or electro-deposited copper runs, and the like. It will be appreciated that the etched out portions of the conductive runs such as shown at 31 may vary from these dimensions in accordance with the desired resistance value to be built into that particular conductive run. The discrete "pumpkin seed" capacitor component 29 is shown as having a thickness of about 0.01 inches and it will be appreciated that this particular component will dominate the silhouette of the cross sectional view of the assembly as taken through plane 3—3. The discrete, "pumpkin seed" capacitor element 29 will include a small conductive electrode of pad shown at 33 which then is connected by means of the fly-lead 32 to a suitable conductive run for connection to the monolithic integrated circuit chip 25.

In order to avoid shorting out or across various ones of the conductive runs 18, etc., the overall flexible, electronic, integrated circuit control assembly preferably is provided with an overlying, protective, electrical insulating layer such as shown at 35, that conforms substantially to the silhouette of the assembly and which extends over substantially the entire surface area of the assembly on the side thereof opposite the flexible insulating supporting member 21 excluding the common contact areas where it is desired to provide for external connections to the power source, or to the sub-assemblies being controlled by the circuit. The overlying, insulating layer 35 may comprise a 0.001 inch thickness or less MYLAR member which is heat sealed or glued at the corners of the assembly, or the corners of that portion of the assembly where it is desired that the overlying insulating layer extend, or the overlying insulating layer may comprise some other conformal seal for the assembly such as an epoxy resin coating, etc.

Figure 4:
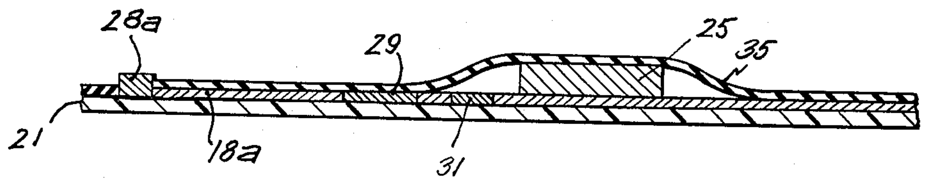
FIG. 4 is a partial sectional view of the assembly shown in FIG. 2 taken through the sectional lines indicated at 4—4 and considering that the assembly shown in FIG. 2 was fabricated by means of thin film circuit techniques.

FIG. 4 is a longitudinal sectional view taken essentially along the plane indicated by the dotted lines marked 4—4 in FIG. 2, and illustrates still a different form of thin film printed circuit constructed in accordance with the invention. The embodiment of the invention shown in FIG. 4 is comprised of a flexible, electrically insulating supporting member of MYLAR or KAPTON 21 whose thickness preferably ranges from 0.001 to 0.005 inches. The conductor runs **18*a*–18*m* are then formed over the underlying flexible MYLAR base 21 by means of ultraviolet radiation or other known thin film printed circuit fabrication techniques such as are disclosed and claimed in the above referenced co-pending United States patent application Ser. No. 784,141, now abandoned and in United States patent application Ser. No. 725,683 entitled "-Buried Metallic Film Devices and Method of Making the Same" — William E. Engeler — inventor filed June 1, 1968, and assigned to the General Electric Company. The thin film printed conductors thus formed have a thickness of about one-tenth of a mil (0.0001 inches), and preferably are patterned so that they achieve the fan out from the contact areas of the monolithic integrated circuit chip. By thus fabricating the thin film printed circuit form of the invention, the need for the intermediate insulating layer 26 and its attached, fanning out conductive paths, is obviated. With respect to the fanning out requirement, it might be noted that the planar dimensions of the monolithic integrated circuit chip 25 shown in FIG. 2, is approximately 0.075 mils by 0.075 mils. If the intermediate, fanning out insulating carrier 26 technique is utilized, then this intermediate fanning out insulating carrier 26 would have a dimension of approximately 0.25 inches by 0.25 inches. From a consideration of these dimensional measurements, it will be appreciated that a fanning out of the conductive runs either through appropriate design of the conductive runs 182–18*m*, or through the use of the intermediate carrier supported fanning out conductors on the member 26**, is necessary.

Returning again to FIG. 4 of the drawings, and tracing across from the left hand to the right hand side, it will be seen that a contact area **28*a* is formed on the profile or silhouette of the board so as to allow ready electrical connection to this terminal from a source such as a battery, or other electronic device with which the circuit is to be connected in circuit relationship. Extending out from the contact area 28 is the portion of the conductive run 18*a* which then jogs up and passes through a hybrid, thin film printed circuit capacitor element 29 such as that described and claimed in U.S. Pat. No. 3,447,218, issued June 3, 1969, "Method of Making A a Capacitor", Archibald N. Wright and Richard C. Merrill, inventors, assigned to the General Electric Company, and is also described in the above-referenced United States patent application Ser. No. 784,141, now abandoned. From this point the dotted line trace 4—4 returns and passes through the thin film printed resistor element 31 which may be fabricated in accordance with an ultraviolet thin film printed circuit fabrication technique such as is described in co-pending United States patent application Ser. No. 731, 090 filed May 22, 1968, entitled "Configurational Depolymerization of Thin Polymer Films," Archibald N. Wright and Richard C. Merrill, inventors, assigned to the General Electric Company, and also described in the above-referenced co-pending U.S. patent application Ser. No. 784,141 now abandoned. It will be noted from a consideration of FIG. 4 that the conductive runs 18*a*–18, the thin film printed circuit capacitor element 29 and the thin film printed circuit resistor element 31 all are of substantially the same thickness approx-imating one-tenth of a mil (0.0001 inches) and while preferably they are fabricated as described in the above-referenced co-pending U.S. patent applications, these elements may be fabricated in accordance with any known thin film printed circuit technique. It will also be noted from FIG. 4 that the monolithic integrated circuit chip 25, which has a thickness ranging from 0.003 to 0.005 inches, dominates the profile or silhouette of the flexible, printed circuit assembly. This form of the invention also preferably employes an overlying protective electrical insulating layer 35 such as that described with relation to the embodiment shown in FIG. 3, and which conforms substantially to the profile of the flexible integrated circuit assembly, and which extends over substantially the entire surface of the assembly on the side thereof opposite the flexible insulating supporting member excluding the common contact areas such as 28*a*** for external connections.

As is best shown in FIG. 5 of the drawings, the common contact area 27 is formed at the end of the elongated tape-like extension **21*b* of the flexible insulating supporting MYLAR base 21 with the ends of the plurality of parallel or converging conductive paths 18*i*–18*m* and 18*b* being coated with at least one additional conductive layer for enhancing the mechanical-electrical contact making characteristics of the ends of the conductive paths comprising the common contact area 27. FIG. 5*b* of the drawings is a longitudinal sectional view of the end of the tape-like extension of the flexible insulating supporting MYLAR base 21 taken through the plane 5*b*–5*b*. From a consideration of FIG. 5*b* it will be seen that the conductive path 18b which overlies the backing MYLAR base 21 is first coated with a solder or tin layer 41 formed on the ends of the conductive paths 18*b* by electro-deposition, plating, etc. with the layer 41 being covered by a thin layer of gold 42 or some other similar contact forming conductive material for providing good electrical connections to an insert, such as is shown at 45 in FIG. 5, that in turn provides electrical connection to the respective flashbulbs that are to be selectively flashed as described in the above-referenced U.S. Pat. No. 3,598,985. It is to be understood that all of the conductive runs 18*i*–18*m* and 18*b* are similarly provided with the additional electrically conductive coating such as was described with respect to the conductive run 18*b***.

Referring again to FIG. 5, it will be seen that the end **21*b* of the tape-like portion of insulating MYLAR base 21 extends through an opening in the housing 11 of the camera into a flash attachment receptacle 43 secured to the camera housing 11. Also secured in the flash attachment receptacle 43 is a multi-fingered spring clip shown at 46 in FIG. 6. The multi-fingered spring clip has a generally U-shaped cross sectional configuration which is disposed upwardly in the flash attachment receptacle 43 so as to receive the insert 45. The respective, additionally coated ends of the conductive runs 18*i*–18*m* and 18*b* are draped over the respective multi-fingered contacts of the clip 46 and secured thereto by suitable bonding techniques so that the spring clip fingers urge each additionally conductive coated path into good electrical contact with corresponding conductive runs formed on the insert member 45. In this manner, a multiple number of detachable, respective, electrical conductive paths can be provided to selectively flash desired ones of a multiple array of photoflash lamps clipped into the flash attachment receptacle by means of an insert member such as 45. It might also be noted, that with respect to FIG. 5 it is not necessary that the additional conductive coating 41, 42 extend to the end of the conductive runs 18*i*–18*m* and 18*b* but may be terminated at some point short of the end of the tape-like extension of the insulating backing MYLAR member 21*b***, should it be desired.

As stated earlier, the particular circuit configuration comprised by the active semiconductor devices formed in the monolithic integrated circuit chip 25 and coacting with the passive electric circuit components such as 29 and 31 may have any desired circuit configuration for controlling a sub-assembly comprising a part of the camera 11 as shown in FIG. 1, or any other comparable electronically operated equipment. However, the particular circuit configuration depicted by FIG. 2 is disclosed in detail in the above-referenced co-pending U.S. patent application Ser. No. 784,067, now abandoned and in particular FIG. 3 of that application. Alternatively, should it be desired, the electronic, integrated circuit flexible, camera control assembly fabricated along the lines described herein could embody an automatic exposure control circuit for automatically timing and variably controlling the exposure period of the camera in response to lighting conditions of a subject being photographed. A suitable, single, monolithic integrated circuit chip, automatic exposure control circuit for this purpose has been described heretofore in the art in a paper entitled "An All Silicon Timing Circuit for Automatic Cameras" presented at the Solid State Sensors Symposium in Minneapolis, Minnesota, on September 1968. It will be appreciated therefore that in place of providing for automatic flash sequence control, the electronic, integrated circuit, flexible control assembly could be designed to provide for automatic exposure control in accordance with the teachings of the present invention, and without departing from the spirit of the invention. The design details of such a modification of the invention are believed to be obvious to one skilled in the electronic art in the light of the above teachings.

FIG. 7 of the drawings is a schematic, perspective sketch of a novel, flexible, electronic integrated circuit, camera control assembly constructed in accordance with the invention, which includes both a flash sequence control 17, and an automatic exposure control such as shown at 61. The novel assembly shown in FIG. 7 would be fabricated along the lines disclosed in detail herein above with respect to the previously described figures of the drawings. Such an overall control assembly when mounted in an electronically controlled camera, would not only be capable of electronically controlling the selective flashing of an array of photoflash bulbs, but it would also incorporate the capability of automatically timing and variably controlling the exposure period of the camera in response to lighting conditions of the subject being photographed to thereby obtain an optimum exposure of the film frame being exposed.

Another advantageous characteristic of the invention not heretofore discussed, is the capability of fabricating the electrically insulating supporting member 21 from a transparent solid organic resin such as the polyester MYLAR or polyimide KAPTON. If the insulating backing member 21 is thus fabricated from a transparent, solid material, it then becomes possible to even intertwine this member through and around the interior of the camera housing 11 in a manner so that it is disposed in a location that is interposed in and traversed by the optical light path of the camera lens assembly. Appropriate modification of the lens assembly design would of course have to be made in order to accommodate any such positioning of the MYLAR backing member 21. Additionally, it might be noted that with respect to the thin film printed circuit form of the invention, the thin film printed conductive runs, thin film resistors and thin film capacitors are so thin and fine in nature (approximately one-tenth of a mil) that it may not even be necessary to so lay out the patterns of the conductive runs so as to leave an open, clear area, such as shown at 65 in FIG. 1 to be traversed by the optical light path so long as the light path traversed is sufficiently transparent. Still another feature which is capable of being provided with the invention is to provide extensions such as shown at 66 and 67 in FIG. 7 of the drawings, of the conductive runs. These extensions actually comprise the conductive runs themselves but provide for electrical terminal connections to the battery power source, etc., without requiring specially formed contact pads such as were described earlier. Additionally, it might be noted that with respect to FIG. 5 of the drawings it is not necessary for the ends of the conductive runs to extend into and comprise a contact area. If desired, the ends of the conductive runs may be bonded to suitable fly-lead conductors or extend in the manner shown in 66 and 67 of FIG. 7 to engage or contact separate contactor spring clips, or the like. Modification of the circuit to provide such separate spring clips or contactors between the ends of the conductor runs and the flash attachment 45, is believed to be obvious to one skilled in the art, and hence will not be described in further detail.

A particularly desirable and advantages feature of the present invention is embodied in FIG. 7 of the drawings. As is shown in FIG. 7, it now becomes possible to fully integrate a single, flexible, electrical control assembly by combining the separate, monolithic, integrated control circuits onto a single, flexible, insulating backing member together with their required internal and external circuit interconnections as well as connecting terminals to outside power sources, and to the sub-assemblies of the overall system being controlled, thereby forming one truly single, electronic, integrated circuit, control assembly. Thus, it will be appreciated that the flexible, integrated circuit, control assembly shown in FIG. 7 is capable of controlling not only the flash sequence but the exposure control as well in addition to any other sub-assembly control functions that it may be desirable to design into an assembly such as that shown in FIG. 7. The capability of designing the required interconnecting conducting paths between the several control sub-circuits onto a single, flexible insulating backing member along with the several, control sub-circuits themselves, eliminates the need for separate conductor runs designed into a housing or other additional backing members, or separate fly-lead jumper connectors, and the like. Thus, it will be appreciated that the invention provides a potent tool to the electronic industry for greatly simplifying the design and fabrication of complex systems employing multiple numbers of sub-circuit controls for controlling various subsystems of the overall complex system.

While the specific application of the invention herein described, is in connection with the control of a multiplicity of automatic camera sub-systems that go to make up an overall camera system providing optimum exposure conditions for an exposed film frame, it is to be expressly understood that the invention is in no way limited to application with cameras alone. If desired, the invention may be used in conjunction with any complex electronic control system comprised of a plurality of electronic sub-system control circuits each subject to microminiaturization. For example, the invention could be utilized with equal facility for combining such sub-circuits as the radio frequency stage, the intermediate frequency stage, the audio frequency stage and the horizontal and vertical video frequency stages of a television receiver wherein each of the stages listed is separately fabricated in monolithic, microminiaturized integrated circuit form, and the several monolithic, microminiaturized sub-circuits are interconnected together into an overall flexible, electronic, integrated circuit control assembly similar to that described for the electronic camera control. Hence, it will be appreciated that the invention makes it possible for the first time to provide a truly single, electronic, integrated circuit control assembly wherein all of the various sub-circuits of the assembly are capable of being formed on and comprise a part of a single, flexible, overall, electronic control assembly.

Having described several embodiments of a new and improved, flexible, electronic, integrated circuit control assembly and the like constructed in accordance with the invention, it is believed obvious that other modifications and variations of the invention are possible in the light of the above teachings. It is therefore to be understood that changes may be made in particular embodiments of the invention described which are within the full intended scope of the invention as defined by the appended claims.

What we claim as new and desire to secure by Letters Patent of the United States is:

1. A flash control assembly for controlling the selective flashing of an array of photoflash lamps, comprising a flash array receptacle provided with a plurality of contact members adapted to respectively engage a plurality of contact members of said array of photoflash lamps, wherein the improvement comprises a flexible electrically insulating circuit support member, a flash control circuit for controlling the selective flashing of said array of flash lamps, said flash control circuit being carried on said flexible support member, and a plurality of electrical conductors carried on said flexible support member and connected between said flash control circuit and respective ones of said contact members of the receptacle, said flexible support member being adapted to be bent into a configuration so as to fit in a desired space.

2. A flash control assembly as claimed in claim 1, in which said flexible support member is in the general shape of an elongated strip, said flash control circuit comprising an integrated circuit chip carried on said elongated flexible support member intermediate the ends thereof, said plurality of electrical conductors extending from said integrated circuit chip in a direction toward a first end of said elongated flexible support member, and a second plurality of electrical conductors carried on said elongated flexible support member and extending from said integrated circuit chip in a direction toward the second end of said elongated flexible support member and adapted for connection to an electrical energy source.

3. A flash control assembly as claimed in claim 1, in which said flexible support member is provided with an irregular shape adapted to cooperate with said bent configuration for causing said flexible support member to fit in said desired space.

4. A flash control assembly as claimed in claim 1, in which said flexible support member is in the general shape of an elongated strip, said flash control circuit being carried on said elongated flexible support member a given distance from an end thereof, said plurality of electrical conductors extending from said flash control circuit toward said end of the elongated flexible support member and extending into said receptacle, and means holding the end regions of said plurality of electrical conductors in said receptacle in positions to function as said contact members of the receptacle.

5. A flash control assembly as claimed in claim 4, in which said means holding the end regions of the plurality of electrical conductors comprises a plurality of spring clips arranged to urge said electrical conductors respectively into contact with said contact members of an array of photoflash lamps when inserted into said receptacle.

6. A photoflash camera assembly, comprising a camera having a housing, and a flash array receptacle carried by said camera housing and provided with a plurality of contact members adapted to respectively engage a plurality of contact members of an array of photoflash lamps, wherein the improvement comprises a flexible electrically insulating circuit support member within said camera housing, a flash control circuit for controlling the selective flashing of said array of flash lamps, said flash control circuit being carried on said flexible support member, and a plurality of electrical conductors carried on said flexible support member and connected between said flash control circuit and respective ones of said contact members of the receptacle, said flexible support member being bent into a configuration to fit in a desired space within said camera housing.

7. An assembly as claimed in claim 6, in which said flexible support member is in the general shape of an elongated strip, said flash control circuit comprising an integrated circuit chip carried on said elongated flexible support member intermediate the ends thereof, said plurality of electrical conductors extending from said integrated circuit chip in a direction toward a first end of said elongated flexible support member, and a second plurality of electrical conductors carried on said elongated flexible support member and extending from said integrated circuit chip in a direction toward the second end of said elongated flexible support member and adapted for connection to an electrical energy source.

8. An assembly as claimed in claim 6, in which said flexible support member is provided with an irregular shape adapted to cooperate with said bent configuration for causing said flexible support member to fit in said desired space within the camera housing.

9. An assembly as claimed in claim 6, in which said flexible support member is in the general shape of an elongated strip, said flash control circuit being carried by said elongated flexible support member a given distance from an end thereof, said plurality of electrical conductors extending from said flash control circuit toward said end of the elongated flexible support member and extending into said receptacle, and means holding the end regions of said plurality of electrical conductors in said receptacle in positions to function as said contact members of the receptacle.

10. An assembly as claimed in claim 9, in which said means holding the end regions of the plurality of electrical conductors comprises a plurality of spring clips arranged to urge said electrical conductors respectively into contact with said contact members of an array of photoflash lamps when inserted into said receptacle.

11. An electronic integrated circuit camera control assembly for controlling the operation of one or more camera sub-assemblies including the selective flashing of an array of photoflash lamps, said camera control assembly comprising a flexible electrically insulating supporting member having camera control integrated circuitry carried thereon, said camera control integrated circuitry including a flash lamp control circuit for controlling said selective flashing of an array of photoflash lamps, and conductive paths carried on said flexible supporting member, said conductive paths being electrically connected to said camera control circuitry and adapted to electrically connect said camera control circuitry to said array of photoflash lamps, said camera control assembly being adapted to be flexed or intertwined within a camera housing.

12. A camera control assembly as claimed in claim 11, in which said camera control integrated circuitry further includes an exposure control circuit for automatically controlling the exposure of the camera in response to lighting conditions of the subject being photographed.

13. An electronic integrated circuit camera control assembly for controlling the operation of one or more camera sub-assemblies, said camera control assembly comprising a flexible electrically insulating support member having camera control integrated circuitry carried thereon for controlling said one or more camera sub-assemblies, and conductive paths carried on said flexible supporting member, said conductive paths being electrically connected to said camera control circuitry and adapted to be electrically connected to said one or more sub-assemblies, said supporting member comprising a transparent solid organic resin and being disposed within the interior of a camera housing in a location such that it is interposed in and traversed by an optical light path of at least one sub-assembly of the camera.

* * * * *